US 11,720,028 B2

(12) United States Patent
Fischer et al.

(10) Patent No.: US 11,720,028 B2
(45) Date of Patent: Aug. 8, 2023

(54) MEASUREMENT ILLUMINATION OPTICAL UNIT FOR GUIDING ILLUMINATION LIGHT INTO AN OBJECT FIELD OF A PROJECTION EXPOSURE SYSTEM FOR EUV LITHOGRAPHY

(71) Applicant: Carl Zeiss SMT GmbH, Oberkochen (DE)

(72) Inventors: Thomas Fischer, Aalen (DE); Lars Wischmeier, Aalen (DE); Michael Patra, Oberkochen (DE); Hubert Holderer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/511,234

(22) Filed: Oct. 26, 2021

(65) Prior Publication Data

US 2022/0057717 A1    Feb. 24, 2022

Related U.S. Application Data

(63) Continuation of application No. PCT/EP2020/061791, filed on Apr. 28, 2020.

(30) Foreign Application Priority Data

Apr. 29, 2019   (DE) .......................... 102019206057.9
Nov. 7, 2019    (DE) .......................... 102019217158.3

(51) Int. Cl.
*G03F 7/20*       (2006.01)
*G03F 7/00*       (2006.01)

(52) U.S. Cl.
CPC ........ *G03F 7/7015* (2013.01); *G03F 7/70133* (2013.01)

(58) Field of Classification Search
CPC ............... G03F 7/7015; G03F 7/70133; G03F 7/70116; G03F 7/70591; G03F 7/70075;
(Continued)

(56) References Cited

U.S. PATENT DOCUMENTS 6,859,515 B2   2/2005   Schultz et al.
6,964,485 B2   11/2005  Singer et al.
(Continued)

FOREIGN PATENT DOCUMENTS

DE   10 2011 004 615 A1   9/2011
DE   10 2011 006 003 A1   5/2012
(Continued)

OTHER PUBLICATIONS

Translation of International Search Report for corresponding Appl No. PCT/EP2020/061791, dated Aug. 14, 2020.
(Continued)

*Primary Examiner* — Mesfin T Asfaw
(74) *Attorney, Agent, or Firm* — Fish & Richardson P.C.

(57) ABSTRACT

A measurement illumination optical unit guides illumination light into an object field of a projection exposure apparatus for EUV lithography. The illumination optical unit has a field facet mirror with a plurality of field facets and a pupil facet mirror with a plurality of pupil facets. The latter serve for overlaid imaging in the object field of field facet images of the field facets. A field facet imaging channel of the illumination light is guided via any one field facet and any one pupil facet. A field stop specifies a field boundary of an illumination field in the object plane. The illumination field has a greater extent along one field dimension than any one of the field facet images. At least some of the field facets include tilt actuators which help guide the illumination light into the illumination field via various field facets and one and the same pupil facet.

20 Claims, 12 Drawing Sheets

(58) Field of Classification Search
CPC ... G02B 26/101; G02B 26/105; G02B 7/1827
See application file for complete search history.

(56) References Cited

U.S. PATENT DOCUMENTS

| | | |
|---|---|---|
| 2011/0228244 A1 | 9/2011 | Mann |
| 2012/0206704 A1* | 8/2012 | Wangler .............. G03F 7/70058 355/77 |
| 2015/0015875 A1* | 1/2015 | Arnz .................. G01N 21/8806 356/237.2 |

FOREIGN PATENT DOCUMENTS

| | | |
|---|---|---|
| DE | 10 2011 076 145 B4 | 4/2013 |
| DE | 10 2012 208 016 A1 | 5/2013 |
| DE | 10 2012 213 368 A1 | 12/2013 |
| DE | 10 2012 218 076 A1 | 4/2014 |
| DE | 10 2015 208 571 A1 | 11/2016 |
| DE | 10 2016 201 317 A1 | 11/2016 |
| DE | 10 2018 207 103 A1 | 3/2019 |
| EP | 1 225 481 A | 7/2002 |
| WO | WO 2011/154244 A1 | 12/2011 |
| WO | WO 2014/075902 A1 | 5/2014 |

OTHER PUBLICATIONS

German Office Action, with translation thereof, for corresponding DE Appl. No. 102019209057.9, dated Dec. 20, 2019.

\* cited by examiner

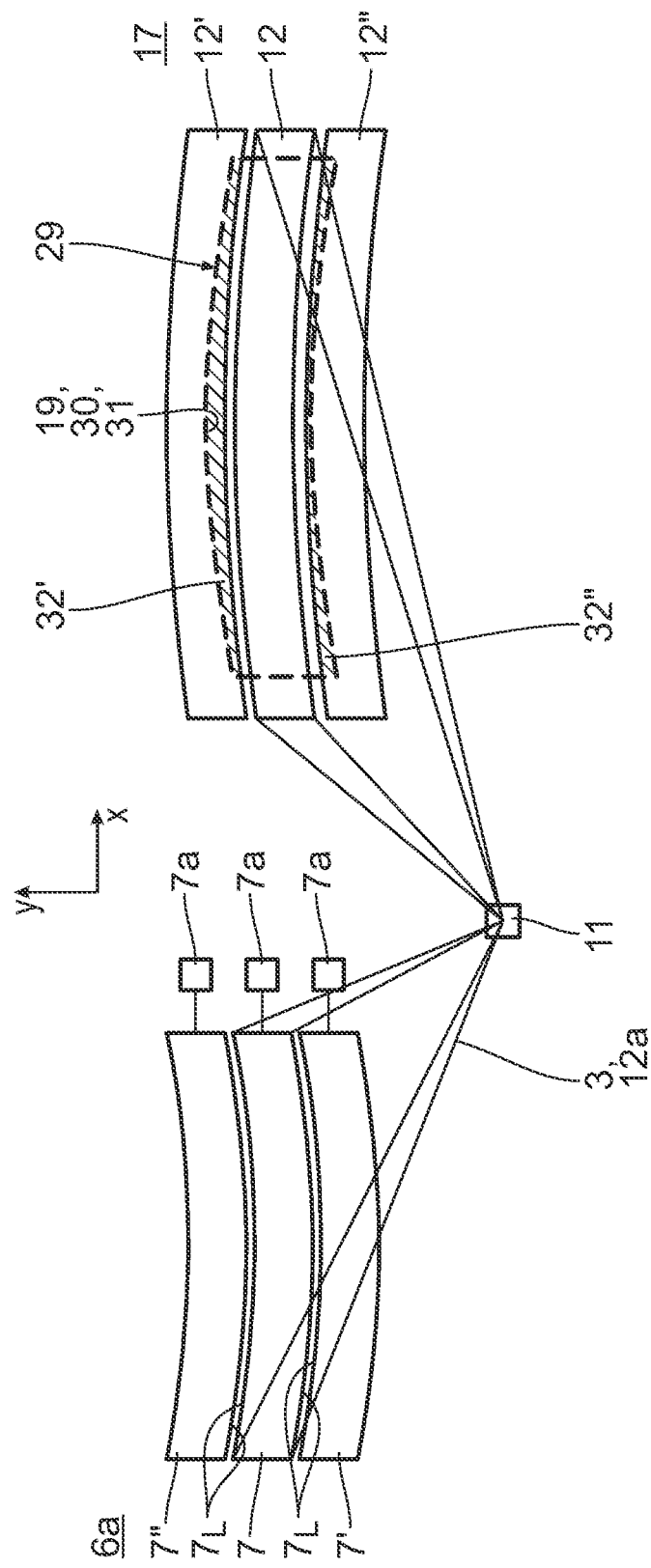

MEASUREMENT ILLUMINATION OPTICAL UNIT FOR GUIDING ILLUMINATION LIGHT INTO AN OBJECT FIELD OF A PROJECTION EXPOSURE SYSTEM FOR EUV LITHOGRAPHY

CROSS-REFERENCE TO RELATED APPLICATIONS

The present application is a continuation of, and claims benefit under 35 USC 120 to, international application PCT/EP2020/061791, filed Apr. 28, 2020, which claims benefit under 35 USC 119 of German Application No. 10 2019 206 057.9, filed Apr. 29, 2019 and German Application No. 10 2019 217 158.3, filed Nov. 7, 2019. The entire disclosure of these applications are incorporated by reference herein.

FIELD

The disclosure relates to a measurement illumination optical unit for guiding illumination light into an object field of a projection exposure apparatus for EUV lithography. Further, the disclosure relates to an illumination system including such a measurement illumination optical unit, a projection exposure apparatus including such an illumination system, a method for producing a microstructured or nanostructured component using such a projection exposure apparatus, and a structured component produced using such a production method.

BACKGROUND

Projection exposure apparatuses with production illumination optical units are known from DE 10 2011 004 615 A1, DE 10 2012 213 368 A1, DE 10 2012 218 076 A1, DE 10 2016 201 317 A1, DE 10 2011 076 145 B4, DE 10 2012 208 016 A1 and DE 10 2011 006 003 A1.

SUMMARY

The disclosure seeks to provide a measurement illumination optical unit that facilitates a full illumination of an illumination field which along one field dimension has a greater extent than a field facet image in the object plane.

In known projection exposure apparatuses, production illumination optical units are typically configured such that an entire object field capable of being imaged via a projection optical unit of the projection exposure apparatus is greater at least along one field dimension than any one of the field facet images and hence also greater than the superposition of all field facet images in the object plane, which is also referred to as the illumination field, as generated by the production illumination optical unit. Along the field dimension, the illumination field is generally also greater than any one of the field facet images. Consequently, a full illumination of the entire illumination field may not be possible using the production illumination optical units. By way of example, such a full illumination can be used for completely measuring imaging properties of a downstream projection optical unit over the entire illumination field and possibly over the object field that is even larger along this field dimension. Thus, the illumination field and the object field can represent a measurement field to be measured. Such a full measurement can be used for the subsequent manufacture of optical components for correcting imaging aberrations of the projection optical unit, such as for manufacturing correction aspheres.

Depending on the embodiments of the measurement illumination optical unit, it is possible by way of an assignment of the respective field facet imaging channels which contribute to the full measurement field illumination to adapt illumination performance variables such as uniformity, illumination setting and crosstalk between various channels to properties of wavefront measurement technology used in the measurement illumination optical unit. To this end, it is possible, such as in a targeted fashion, to add or remove certain field facet imaging channels for the full measurement field illumination and the subsequent measurement of the imaging properties of a downstream projection optical unit. For example, it is also possible to specify an illumination setting that is also used in the production projection illumination. This can also bring about certain settings that can detect channel crosstalk between different field facet imaging channels. Further, a darkfield illumination can also be set in a targeted fashion; in this case, only light that has been diffracted at the structured object is guided through the projection optical unit, and not directly reflected light. By way of example, the result of a measurement using the measurement illumination optical unit can be used to correct an ellipticity which is generated on account of pupil imaging that deviates from an isomorphy.

According to an aspect, it was recognized that a displacement of an optical component, which guides the illumination light, for generating a sequential illumination of the entire measurement field by the field facet imaging channels can facilitate an effective full illumination of the measurement field. This yields a dynamic illumination of the entire measurement field.

The measurement illumination optical unit or imaging optical unit can include a field stop for specifying a field boundary of a measurement field in an object plane in which the object field is arranged. Along a full illumination field dimension, the measurement field can have a greater extent than any one of the field facet images. At least some (field) facet images can be displaceable together along the full illumination field dimension relative to the measurement field by way of the at least one displacement actuator for at least one component of the illumination optical unit.

The field stop can specify a field boundary of the measurement field. The measurement field can be located in the object plane in which the object field is arranged.

The displacement actuator can be configured as a tilt actuator and/or as a translation actuator for the optical component.

The optical component can be held via a vibration damping mechanism. A movement of the displacement actuator can be subject to closed-loop control. To this end, the measurement illumination optical unit can include a sensor system, such as for capturing a position of an optical surface of the optical component.

The measurement information is measured by a detection device of the measurement illumination optical unit in spatially resolved and non-scanning fashion. In general, illuminating an object plane, in which the object field is located, outside of the object field has no negative consequences for the measurement of properties of a projection optical unit for points within the object field.

A displacement of at least some field facet images relative to the illumination field or measurement field can be used for an effective full illumination of the illumination field or measurement field. In this case, the full illumination of the illumination field or measurement field can be implemented sequentially by virtue of the facet images being displaced through the illumination field or measurement field.

The displacement actuator can be configured as a tilt actuator for the pupil facet mirror. The measurement illumination optical unit can include a condenser mirror as part of the imaging optical unit for generating the field facet mirrors. The displacement actuator can be configured as a tilt actuator for the condenser mirror. The displacement actuator can be configured as a translation actuator for the illumination optical unit relative to the field plane. The displacement actuator can interact with at least one portion of the field facet mirror carrying a field facet group, with the interaction serving the purpose of displacing the field facet mirror or the field facet mirror portion. Such embodiments of the displacement actuators and/or an embodiment of the displacement actuator can be suitable for a common relative displacement of at least some facet images relative to the illumination field or measurement field. Such a displacement actuator can for example bring about a displacement of exactly one bar, i.e., a field facet group, of the field facet mirror. Such a displacement device of the displacement actuator can be perpendicular to an arrangement plane of the field facets on the field facet mirror or on the field facet mirror portion to be displaced.

A displacement by the displacement actuator can be implemented in a normal direction at the point of incidence on an optical surface of the component of the field facet mirror to be displaced.

The displacement actuator can be configured such that it interacts with at least one portion of the pupil facet mirror carrying a pupil facet group, with the interaction serving the purpose of displacing the pupil facet mirror or the pupil facet mirror portion. Such a displacement device of the displacement actuator can be perpendicular to an arrangement plane of the pupil facets on the pupil facet mirror or on the pupil facet mirror portion to be displaced. As an alternative or in addition thereto, the displacement actuator can be configured such that an individual displacement of individual pupil facets of the pupil facet mirror is possible. Actuator regions of the displacement actuator assigned individually to the individual pupil facets can thus be controllable together such that this can also bring about a common displacement of the pupil facets.

The measurement illumination optical unit can include at least one further mirror component which guides the illumination light between the pupil facet mirror and the object field, wherein the displacement actuator is configured such that it interacts with the mirror component for the purposes of displacing the mirror component. Such a displacement actuator can be embodied as a translation or tilt actuator. A displacement direction of the displacement actuator can be perpendicular to an optical surface of the mirror component. The mirror component can be a condenser mirror as part of an imaging optical unit for generating the field facet images.

The displacement actuator can be configured to displace the measurement illumination optical unit relative to the object field of a projection optical unit which is disposed downstream of the measurement illumination optical unit and which serves to image the object field into an image field. Such a displacement actuator can be embodied as a translation and/or tilt actuator.

The displacement actuator can be configured to displace an object holder relative to the remainder of the measurement illumination optical unit. Such a displacement can be configured as a translation actuator with a displacement direction, such as perpendicular to the object plane, and/or as a tilt actuator.

According to an aspect, it was recognized that the guidance of illumination light via various field facets and one and the same pupil facet can lead to the option of illuminating the illumination field even in regions in which there is no illumination by the overlaid imaging of the field facets by way of guidance via the field facet imaging channels. On account of the unavoidable spatial variations of relative positions of the field facet imaging channels, this can yield a mixture in the positioning of the arising additional field facet mirrors which are located in the proximity of the field facet images imaged in overlaid fashion, leading to a complete illumination of the illumination field.

The pupil facets can bring about the overlaid generation of the field facet images overall, or else can be part of an imaging optical unit which images the field facets into the object plane in each case.

Using the measurement illumination optical unit, it is possible to provide in all illumination field points a pupil which is homogeneous within specified tolerances.

The field facets which would be imaged into the illumination field via one and the same pupil facet by way of their tilt can be directly adjacent field facets of the field facet mirror.

The field facets can have a reflection surface with an aspect ratio of greater than two, with an embodiment of the tilt actuators such that the guidance of illumination light into the illumination field via field facets which are adjacent to one another by way of one field facet longitudinal side and via one and the same pupil facet is ensured. Such embodiments can facilitate an effective full illumination of the illumination field.

For example, the displacement actuator can have a hexapod support connection. Using such a hexapod support connection, the displacement actuator can be connected to a main body of the optical component to be displaced. Individual control of retractable or extendable hexapod legs of the hexapod support connection allows the realization of different tilt and/or translation adjustments of the main body and/or of an optical surface of the optical component to be displaced by the displacement actuator.

An assembly made of, firstly, one of the optical components of the measurement illumination optical unit and, secondly, the displacement actuator can be part of the subject matter of the disclosure, independently of further components of the measurement illumination optical unit.

A measurement illumination optical unit used simultaneously as a production illumination optical unit can lead to a flexible projection exposure apparatus. Features of a measurement illumination optical unit configured as a production illumination optical unit for the projection exposure apparatus can correspond to those explained above.

Features of related illumination systems including a measurement illumination optical unit according to the disclosure can correspond to those explained above.

An illumination system can include a measurement illumination optical unit according to the disclosure and a projection optical unit for imaging the object field into an image field, in which a substrate is arrangeable, of the projection exposure apparatus, wherein the displacement actuator is configured as a translation actuator for the illumination optical unit relative to the projection optical unit. Such a displacement actuator can represent an represent an approach for displacing facet images relative to the illumination field.

In an aspect, a measurement illumination optical unit serving to guide illumination light into an object field, in which a lithography mask is arrangeable, of a projection exposure apparatus for EUV lithography, includes:

a detection device for spatially resolved capture of an illumination light intensity in a measurement field, a displacement actuator for displacing at least one optical component of the measurement illumination optical unit which guides the illumination light between an illumination-light light source and the object field, a sensor for capturing a position of an optical surface of the optical component, wherein for the controlled movement of the displacement actuator the latter is signal connected to the sensor and/or the detection device.

For example, such a measurement illumination optical unit can be used for controlled movement of the displacement actuator.

Features of an illumination system including a measurement illumination optical unit according to the disclosure, a projection exposure apparatus including such an illumination system, a production method of using such a projection exposure apparatus, and a microstructured or nanostructured component produced by such a method can correspond to those explained above with reference to the illumination optical unit according to the disclosure. The produced component can be a semiconductor chip, for example a memory chip.

The projection exposure apparatus can have an object holder with an object displacement drive for displacing, in an object displacement direction, the object to be imaged. The projection exposure apparatus can have a wafer holder with a wafer displacement drive for displacing, in an image displacement direction, a wafer on which a structure of the object to be imaged is to be imaged. The object displacement direction may extend parallel to the image displacement direction.

The above-described subjects can be part of the subject matter of the disclosure, either in combination with one another or on their own.

BRIEF DESCRIPTION OF THE DRAWINGS

Exemplary embodiments of the disclosure are explained in greater detail below with reference to the drawings, in which:

FIG. 5A very schematically shows a beam guidance of illumination light which is transmitted from three adjoining field facets of the field facet mirror according to FIG. 3 via one and the same pupil facet into an illumination field in an object plane of the measurement illumination optical unit into field facet images;

DESCRIPTION OF EXEMPLARY EMBODIMENTS

Figure 1:
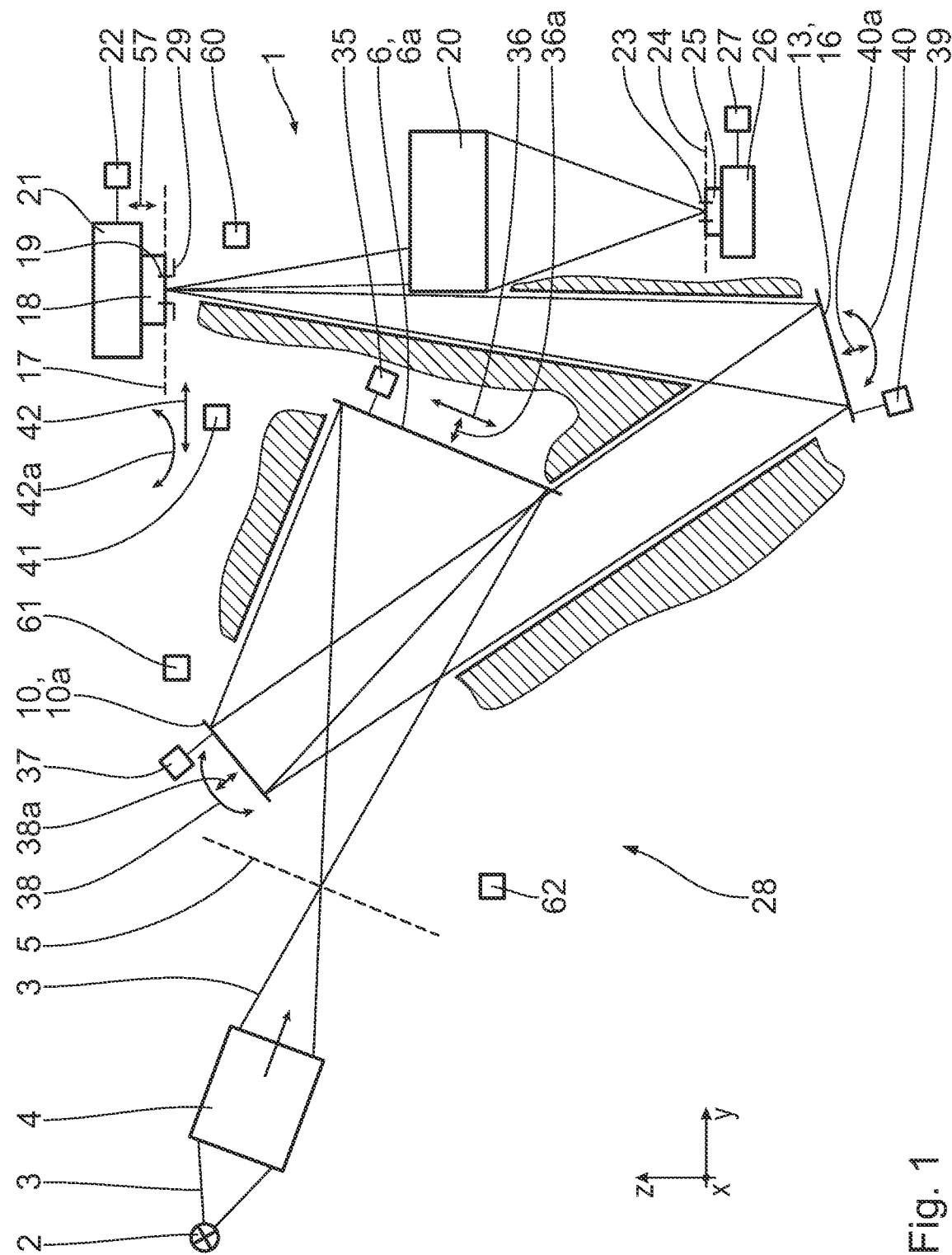
FIG. 1 shows, schematically and in the meridional section in relation to a measurement illumination optical unit, a microlithographic projection exposure apparatus that uses this measurement illumination optical unit.

A microlithographic projection exposure apparatus 1 serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron or a free electron laser (FEL) may also be used for the light source 2. Information concerning such a light source can be found by the person skilled in the art in U.S. Pat. No. 6,859,515 B2, for example. EUV illumination light or illumination radiation in the form of an illumination light beam or imaging light beam 3 is used for illumination and imaging within the projection exposure apparatus 1. The imaging light beam 3 downstream of the light source 2 firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A. Downstream of the collector 4, the EUV illumination light 3 first passes through an intermediate focal plane 5, which can be used for separating the imaging light beam 3 from undesirable radiation or particle portions. After passing through the intermediate focal plane 5, the imaging light beam 3 firstly impinges on a field facet mirror 6. The field facet mirror 6 constitutes a first facet mirror of the projection exposure apparatus 1. The field facet mirror 6 includes a plurality of field facets (see also FIGS. 2 and 3) which are arranged on a first mirror carrier 6a. The mirror carrier 6a is also referred to as the main body of the field facet mirror 6.

In order to facilitate the description of positional relationships, a Cartesian global xyz-coordinate system is in each case depicted in the drawing. In FIG. 1, the x-axis extends perpendicularly to the plane of the drawing and out of the latter. The y-axis extends toward the right in FIG. 1. The z-axis extends toward the top in FIG. 1.

In order to facilitate the description of positional relationships for individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component about the x-axis.

Figure 2:
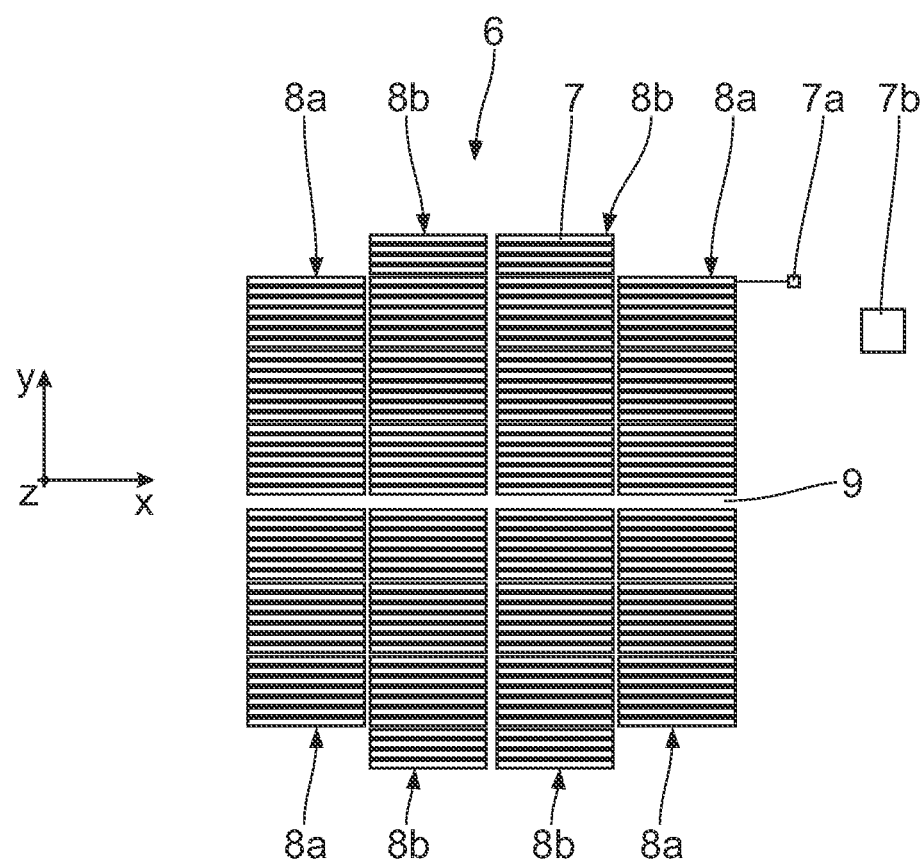
FIG. 2 shows a view of a facet arrangement of a field facet mirror of the illumination optical unit of the projection exposure apparatus according to FIG. 1, in the "rectangular field" embodiment.

FIG. 2 shows, in an exemplary manner, a facet arrangement of field facets 7 of the field facet mirror 6 in the "rectangular field" embodiment. The field facets 7 are rectangular and have in each case the same x/y aspect ratio. The x/y aspect ratio is greater than 2. The x/y aspect ratio can be for example 12/5, can be 25/4, can be 104/8, can be 20/1 or can be 30/1.

The field facets 7 predetermine a reflection surface of the field facet mirror 6 and are grouped into four columns with 6 to 8 field facet groups 8a, 8b each. The field facet groups 8a respectively have seven field facets 7. The two additional field facet groups 8b, on the edge, of the two central field facet columns respectively have four field facets 7. The facet arrangement of the field facet mirror 6 has interstices 9, in which the field facet mirror 6 is shadowed by holding spokes of the collector 4, between the two central facet columns and between the third facet line and the fourth facet line. To the extent that an LPP source is used as the light source 2, corresponding shadowing may also emerge from a tin droplet generator which is arranged adjacent to the collector 4 and not depicted in the drawing.

The field facets 7 are repositionable, in each case between a plurality of different tilt positions, for example repositionable between three tilt positions. Depending on the embodiment of the field facet mirror 6, all or else some of the field facets 7 can also be repositionable between two or between more than three different tilt positions. To this end, each of the field facets is respectively connected to an actuator 7a, which is depicted very schematically in FIG. 2. The actuators 7a of all tiltable field facets 7 can be actuated by way of a central control device 7b, which is likewise depicted schematically in FIG. 2.

The actuators 7a can be designed such that they tilt the field facets 7, 7', 7" (cf. FIG. 5A) through discrete absolute tilt values. By way of example, this can be ensured by tilting between two end stops. A continuous tilt or a tilt between a greater number of discrete tilt positions is also possible.

After reflection at the field facet mirror 6, the imaging light beam 3 split into imaging light partial beams assigned to the individual field facets 7 impinges on a pupil facet mirror 10. The respective imaging light partial beam of the entire imaging light beam 3 is guided along a respective imaging light channel, which is also referred to as the illumination channel or field facet imaging channel.

Figure 3:
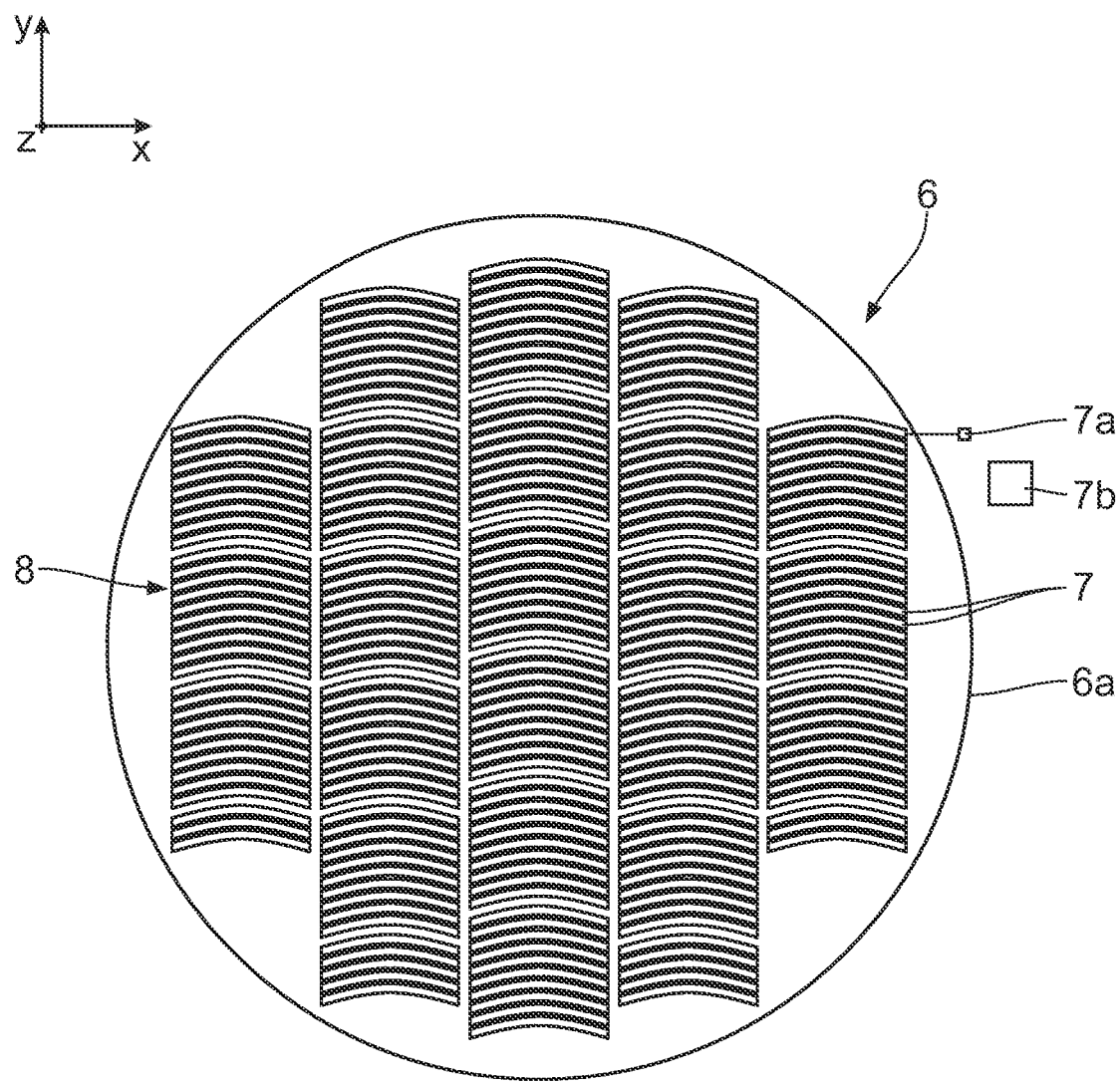
FIG. 3 shows, in an illustration similar to FIG. 2, a facet arrangement of a further embodiment of a field facet mirror in the "arcuate field" embodiment.

FIG. 3 shows a further "arcuate field" embodiment of a field facet mirror 6. Component parts that correspond to those that were explained above with reference to the field facet mirror 6 according to FIG. 2 have the same reference signs and are only explained to the extent that these differ from the component parts of the field facet mirror 6 according to FIG. 2.

The field facet mirror 6 according to FIG. 3 includes a field facet arrangement with arcuate field facets 7. These field facets 7 are disposed in a total of five columns with, in each case, a plurality of field facet groups 8. The field facet arrangement is inscribed in a circular boundary of the mirror carrier 6a of the field facet mirror 6.

The field facets 7 in the embodiment according to FIG. 3 all have the same area and the same ratio of width in the x-direction and height in the y-direction, which corresponds to the x/y-aspect ratio of the field facets 7 of the embodiment according to FIG. 2.

Figure 4:
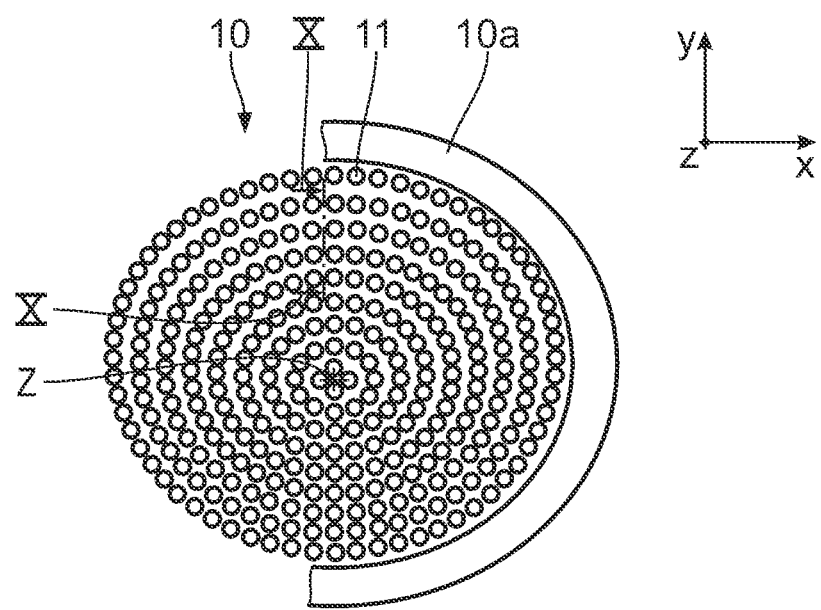
FIG. 4 shows an embodiment of a facet arrangement of a pupil facet mirror.

FIG. 4 very schematically shows an exemplary facet arrangement of pupil facets 11 of the pupil facet mirror 10. The pupil facet mirror 10 constitutes a second facet mirror of the projection exposure apparatus 1. The pupil facets 11 are arranged on a carrier plate 10a of the pupil facet mirror 10, which is only indicated in a circumferential portion in FIG. 4. The pupil facets 11 are arranged around a facet arrangement center on the pupil facet mirror carrier 10a. The pupil facet mirror carrier 10a is also referred to as the main body of the pupil facet mirror 10.

One pupil facet 11 is assigned to each imaging light partial beam of the EUV illumination light 3 reflected by one of the field facets 7, with the result that a facet pair that is impinged upon in each case and has exactly one of the field facets 7 and exactly one of the pupil facets 11 specifies the imaging light channel for the associated imaging light partial beam of the EUV illumination light 3.

The channel-by-channel assignment of the pupil facets 11 to the field facets 7 is implemented on the basis of a desired illumination by the projection exposure apparatus 1. By way of different possible field facet tilt positions, each of the field facets 7 can specify different imaging light channels. The illumination light partial beams are guided overlaid on one another into an object field, yet to be explained, of the projection exposure apparatus 1 via the field facet imaging channels specified thus.

Using the pupil facet mirror 10 (FIG. 1) and a downstream transfer optical unit 16 having a condenser mirror 13, the field facets 7 are imaged into an object plane 17 of the projection exposure apparatus 1.

FIG. 5A schematically shows the conditions when imaging one of the field facets 7 into a field facet image 12 using the example of the "arcuate field" embodiment. A beam path of the associated field facet imaging channel 12a is illustrated in unfolded fashion in FIG. 5A and the associated pupil facet 11 of this field facet imaging channel 12a is elucidated as only component of the transfer optical unit 16.

Moreover, in FIG. 5A, the field facets 7 on the one hand and the object plane 17 on the other hand are each illustrated in the plane of the drawing, i.e., they are located in one plane in FIG. 5A, which is regularly not the case in reality.

A variant of the transfer optical unit in which only the respective pupil facet 11 ensures the imaging of the associated field facet 7 into the field facet image 12 is also possible. It is possible to dispense with the transfer optical unit 16 provided that the pupil facet mirror 10 is arranged directly in an entry pupil of a projection optical unit 20. The transfer optical unit 16 can also include a plurality of mirrors. Arranged in the object plane 17 is an object in the form of a lithography mask or a reticle 18, an illumination region of which is illuminated with the EUV illumination light 3 and overlaps with the object field 19 of the downstream projection optical unit 20 of the projection exposure apparatus 1. The illumination region is also referred to below as an illumination field (cf. FIG. 5A), which is yet to be explained below, and can just like the object field 19 represent a measurement field of a measurement illumination optical unit yet to be described below. The object field 19 is rectangular or arcuate depending on the concrete embodiment of an illumination optical unit of the projection exposure apparatus 1. The field facet images 12 of the field facet imaging channels are overlaid in the illumination field. In the case of a perfect superposition of all field facet images 12, this overlay region has the same outer contour as exactly one of the field facet images 12. What arises on account of the different spatial beam guidances of the various field facet imaging channels is that the superposition of the individual field facet images 12 in the object plane 17 is regularly not perfect.

The EUV illumination light 3 is reflected by the reticle 18. The reticle 18 is held by an object holder 21, which is displaceable in a driven manner in the displacement direction y with the aid of an object displacement drive 22 indicated schematically.

The projection optical unit 20 images the object field 19 in the object plane 17 into an image field 23 in an image plane 24. Arranged in the image plane 24 is a wafer 25 carrying a light-sensitive layer, which is exposed during the projection exposure via the projection exposure apparatus 1. The wafer 25, that is to say the substrate onto which imaging is effected, is held by a wafer or substrate holder 26, which is displaceable in the displacement direction y synchronously with the displacement of the object holder 21 with the aid of a wafer displacement drive 27 likewise indicated schematically. During the projection exposure, both the reticle 18 and the wafer 25 are scanned in a synchronized manner in the y-direction. The projection exposure apparatus 1 is embodied as a scanner. The scanning direction y is the object displacement direction.

The field facet mirror 6, the pupil facet mirror 10 and the condenser mirror 13 of the transfer optical unit 16 are parts of an illumination optical unit 28 of the projection exposure apparatus 1. Together with the projection optical unit 20, the illumination optical unit 28 forms an illumination system of the projection exposure apparatus 1. The illumination optical unit 28 simultaneously has the function of a measurement illumination optical unit, as is yet to be explained below.

A respective group of pupil facets 11, which are impinged by the illumination light 3 via field facets 7 assigned to appropriate illumination channels, defines a respective illumination setting, i.e., an illumination angle distribution when illuminating the object field 19, which can be predetermined by the projection exposure apparatus 1. By repositioning the tilt positions of the field facets 7, it is possible to change between various such illumination settings. Examples of such illumination settings are described in WO 2014/075902 A1 and WO 2011/154244 A1.

FIG. 5A shows a field stop 29, which is also referred to as scanning slit, in the object plane 17 in addition to the field facet image 12. An inner boundary 30 of the field stop 29 specifies a field boundary of the illumination field 31 or of the measurement field 19. The object field 19 can correspond to the illumination field 31 or measurement field, or can be a part thereof. Therefore, both reference signs 19 and 31 are assigned to the measurement field below.

The field stop 29 is arranged in the vicinity of the object plane 17 or in a plane conjugate thereto. An arrangement of the field stop 29 in the vicinity of the object plane 17 is indicated in FIG. 1.

Figure 5B:
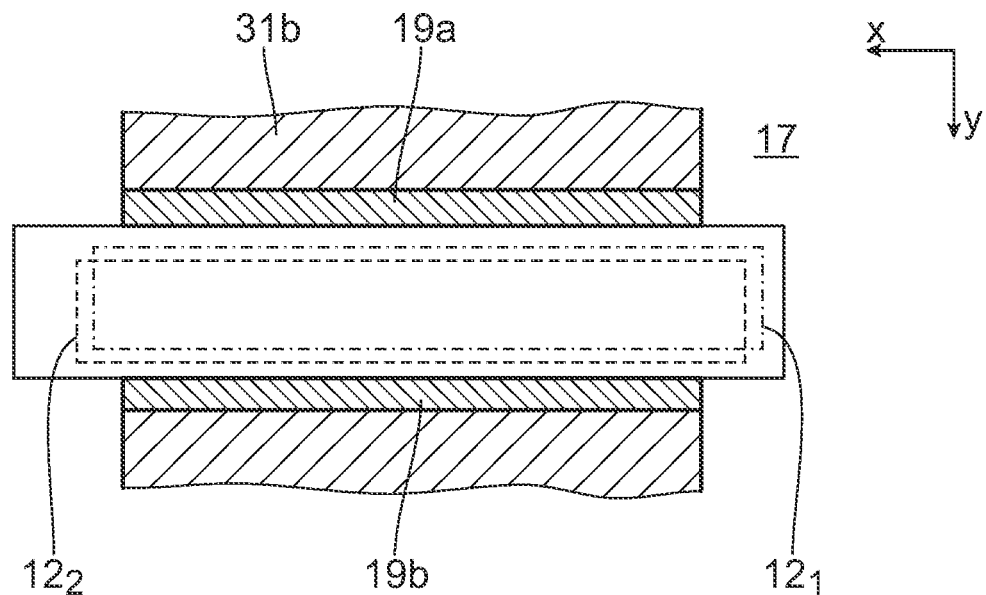
FIG. 5B schematically shows a representation of different field regions in the object plane of the projection exposure apparatus and of the measurement illumination optical unit.
Figure 5C:
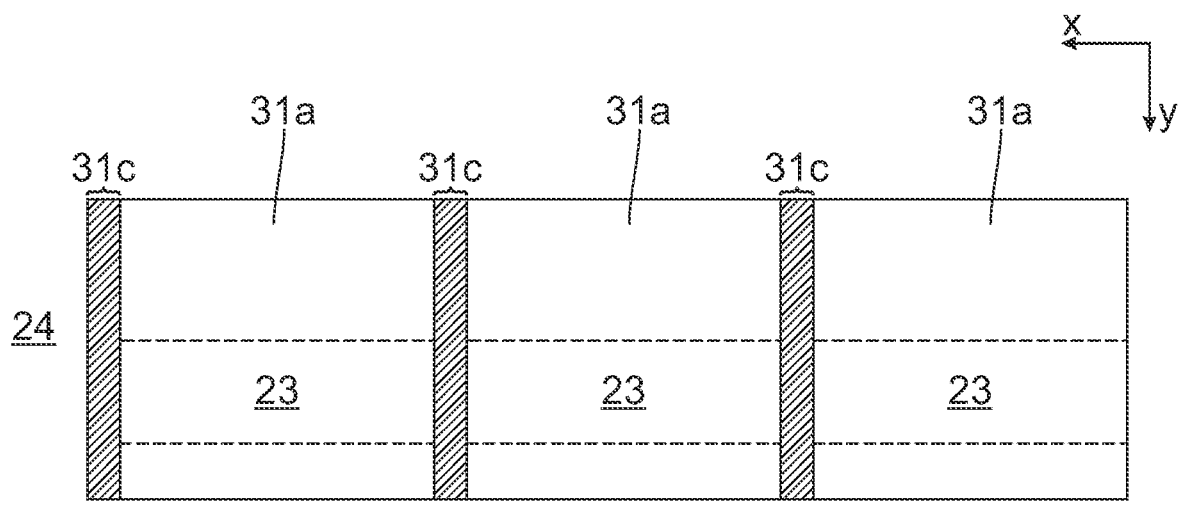
FIG. 5C shows different field regions in an image plane of the projection exposure apparatus.

FIGS. 5B and 5C are used in the following to describe the size relationships between the various, aforementioned regions, firstly in the object plane 17 (FIG. 5B) and secondly in the image plane 24 (FIG. 5C).

The projection optical unit 20 images a region of the object plane 17, in which the reticle 18 is arranged, onto the image plane 24. The imaging quality is sufficiently high for a certain region of the object plane 17, and so this region can be used for imaging structures onto the reticle 18. This region in the object plane 17 is the object field 19. The region of the image plane 24 which is conjugate to the object field 10 and to where the object field 19 is imaged by the projection optical unit 20 is the image field 23.

The EUV illumination light 3 entering the projection optical unit 20 moderately outside of the object field 19 can likewise reach the image plane 24 and hence expose a photosensitive layer on the wafer 35. However, the imaging by the projection optical unit 20 for regions outside of the object field 19 is worse than the imaging of the object field 19, and therefore the regions outside are not used.

The illumination optical unit 28 illuminates a region of the object plane 17. This region is the illumination field 31. The illumination field 31 arises as a union of all field facet images 12, of which two field facet images $12_1$ and $12_2$ are shown in exemplary fashion in FIG. 4B. As a rule, each field facet image 12 is smaller than the illumination field 31.

During the scanning procedure, the image field 23 is moved relative to the wafer 25 along the scanning direction or the object displacement direction y and hence the photosensitive layer on the wafer 25 is exposed. A certain region 31a on the wafer can be structured by a respective, individual scanning movement; this region 31a is referred to as exposure field and corresponds to the image of the totality of structures in a structure region 31b on the reticle 18. Typically, the width of the structure region 31b on the reticle 18 is matched to the width of the object field 19 in the x-dimension, i.e., perpendicular to the scanning direction y. For example, the x-width of the structure region 31b equals the x-width of the object field 19 or the x-width of the structure region 31b on the reticle 18, and is only marginally smaller than the width of the object field 19.

The x-width of the exposure field 31a is given by the x-width of the image field 23. The EUV illumination light 3 which enters the projection optical unit 20 moderately next to the object field 19 in the cross-scan direction x can expose a region moderately next to the exposure field 31a. Disadvantageous effects of such a crosstalk in the x-direction can be prevented by virtue of, firstly, a small spacing 31c not used for the projection exposure being left free in the cross-scan direction x between adjacent exposure fields 31a, and secondly by virtue of the reticle 18 being configured to be absorbent outside of the structure region 31b such that no EUV illumination light 3 is incident next to the object field 19 in the cross-scan direction x.

The illumination field 31 is wider than the object field 19 in the x-direction. If the illumination field 31 were too small in the x-direction on account of tolerances, certain regions of the reticle 18 would not be illuminated and could accordingly not be imaged by the projection optical unit 20 either. On account of tolerances that are always present, the illumination field 31 is therefore wider than the object field 19 in the x-direction.

In the cross-scan direction x, the boundary of the image field 23 is identical to the boundary of the exposure field 31a. Therefore, problems with EUV illumination light 3 outside of the object field 19 can be avoided by the spacing 31c between the exposure fields 31a and/or by absorbing regions on the reticle 18. This is not possible in the scanning direction y because the exposure field 31a extends further than the image field 23 in the scanning direction y.

In the scanning direction, it is desirable to prevent the EUV illumination light 3 from entering the projection plane 20 outside of the object field 19. This is ensured by virtue of the illumination field 31 having a shorter embodiment than the object field 19 in the scanning direction.

Unilluminated edge regions of the object field 19, for example the edge regions 19a and 19b which are located outside of the illumination field 31 in the scanning direction y, do not impair the generation of structures in the wafer 25 since the reticle 18 is scanned through the object field 19 and hence the entire structure region 31b of the reticle 18 reaches the illuminated region of the object field 19, i.e., the superposition between the object field 19 and illumination field 31. The edge regions 19a and 19b are likewise located in the measurement field of the measurement illumination optical unit 28, as will still be explained below. In both the x-direction and the y-direction, the extents of this measurement field correspond at least to the object field 19, and so this reference sign 19 is likewise used for the measurement field below.

The illumination field 31 or measurement field 19 has a greater extent than the field facet image 12 along the field dimension, which coincides with the object displacement direction y, and also has a greater extent than the superposition region of the various field facet images 12 during the overlaid imaging.

A corresponding field dimension y is also assigned to this object field dimension y in the arrangement plane of the field facet mirror. In this arrangement plane of the mirror carrier 6a, FIG. 5A shows two closest field facets 7', illustrated below the field facet 7, and 7", illustrated above the field facet 7, to the field facet 7, which is imaged by the field facet imaging channel 12a, along this field dimension y.

In FIG. 5A, the field facets 7', 7" are adjacent to one another by way of a respective facet longitudinal side $7_L$.

The actuators 7a of these further field facets 7', 7" facilitate a tilt of these field facets 7', 7" about an axis parallel to the x-axis, to such an extent that the illumination light 3 incident on these field facets 7', 7" can likewise be steered to the pupil facet 11 illustrated in FIG. 5A. The field facet images 12', 12" generated in that case by way of the pupil facet 11 are likewise illustrated in FIG. 5A, above and below the field facet image 12. These field facet images 12', 12" are not guided via field facet imaging channels in the style of channel 12a in FIG. 5A, i.e., they are not guided overlaid on one another into the object field 19 of the projection exposure apparatus 1.

The field facet images 12', 12" overlap with the illumination field 31 in overlap regions 32', 32", which are illustrated in FIG. 5A by hatching. Thus, the tilt actuators 7a of the field facets 7', 7" ensure a guidance of the illumination light 3 via these field facets 7', 7" and one and the same pupil facet 11 into the illumination field 31 or measurement field 19, specifically into the overlap regions 32', 32" of the illumination field 31 or measurement field 19.

FIG. 5A illustrates the illumination of additional overlap regions 32', 32" using the example of exactly one field facet triplet with field facets 7', 7". As shown by the exemplary embodiments in FIGS. 2 and 3, the field facet mirror in fact has a very much larger number of field facets 7, which is even significantly larger in practice than in the illustrated embodiments. Moreover, the spatial arrangement relationships of the field facets 7 and pupil facet 11 assigned to one another in each case by way of the field facet imaging channels 12a lead to the field facet images 12, 12', 12" of each pupil facet 11 differing from one another in terms of their size, orientation and edge sharpness. This leads to regions within the illumination field 31 covered firstly by the field facet image 12 of the respective field facet imaging channel 12a and by the overlap regions 32', 32" differing from one another. By mixing these different coverages a complete illumination of the illumination field 31 or measurement field 19 arises from the sum of all possible field facet imaging channels 12a, and so the gaps present in FIG. 5A between the field facet image 12 and the overlap regions 32', 32" are also illuminated by the illumination or imaging light 3.

Thus, by way of an appropriate repositioning of the actuators 7a, a state can be attained in the "measurement illumination optics" mode of operation, in which state the complete illumination field 31 or measurement field 19 is illuminated even though each of the field facet images 12 assigned by way of the respective field facet imaging channel 12a has a smaller extent than the illumination field 31 or measurement field 19 in the field dimension y.

This attainable complete illumination of the illumination field 31 or measurement field 19 can be used for the complete measurement of the projection optical unit 20 for the subsequent manufacture of imaging aberration correction components, for example correction aspheres.

In conjunction with FIG. 1, a further embodiment of a measurement illumination optical unit is explained below on the basis of FIGS. 6 and 7. Components and functions corresponding to those which have already been explained above with reference to FIGS. 1 to 5 have the same reference signs and will not be discussed in detail again.

Figure 6:
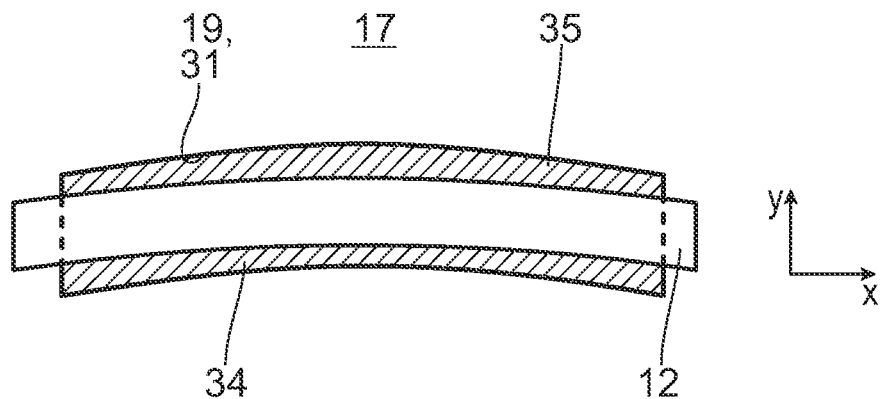
FIG. 6 shows a positional and size relationship of, firstly, an object field of the measurement illumination optical unit in which there is overlaid imaging of field facet images of the field facets and, secondly, an illumination field specified by way of a field boundary of a field stop of the measurement illumination optical unit, wherein this positional relationship is illustrated during normal operation of a measurement in the region of an illumination field center.

Similar to FIG. 5A, FIG. 6 shows both the field facet image 12, which is imaged into the object plane 17 by way of a field facet imaging channel 12a, and the illumination field 31 or measurement field 19 specified by the field stop 29. Once again, the illumination field 31 or measurement field 19 has a greater extent than the respective field facet image 12 along the field dimension y, which is also referred to as full illumination field dimension. In this case, FIG. 6 shows an instantaneous situation during the operation of the measurement illumination optical unit, in which the measurement illumination optical unit is aligned such that the field facet image 12, and for example also the superposition of the field facet images 12 generated by way of the various field facet imaging channels 12a in the object plane 17, is arranged centrally in the illumination field 31 or measurement field 19 along the full illumination field dimension y.

Figure 7:
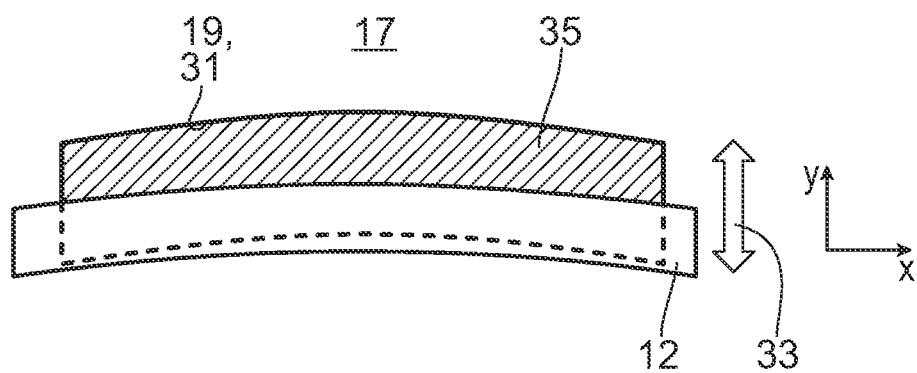
FIG. 7 shows an illustration similar to FIG. 6, wherein the positional relationship is illustrated in the case of a measurement by the measurement illumination optical unit at the edge of the illumination field.

FIG. 7 shows a further instantaneous situation when operating the measurement illumination optical unit, in which a relative displacement (cf. double-head arrow 33) has been attained between the field facet image 12 and the illumination field 31 or measurement field 19 with the aid of at least one displacement actuator, in the case of which displacement the field facet image 12 has been displaced relative to the illumination field 31 or measurement field 19 in the negative y-direction in FIG. 7. This attains an illumination of the illumination field 31 or measurement field 19 in a lower full illumination region 34, which is not covered by the centrally arranged field facet image 12 and which is illustrated in FIG. 6 by hatching. As a result of a corresponding displacement of the field facet image 12 in the positive y-direction, it is also possible to attain an illumination of the full illumination region 35, which is likewise illustrated by hatching in FIG. 6 above the field facet image 12 and within the illumination field 31 or measurement field 19.

The relative displacement 33 can be generated with the aid of at least one displacement actuator as part of the measurement field illumination device, for which FIG. 1 schematically illustrates a plurality of exemplary embodiments which can be used individually or in any combination.

The measurement field illumination device, which has at least one of the displacement actuators described below, influences a guidance of the illumination light 3 via the field facet imaging channels 12a for generating an illumination of the entire measurement field 31 by the field facet imaging channels 12a. The at least one displacement actuator of the measurement field illumination device serves to displace at least one optical component that guides the illumination light 3 between the illumination-light light source 2 and the object field 19, specifically the field facet mirror 6, the pupil facet mirror 10, the condenser mirror 13, the entire illumination optical unit 28 or else the reticle 18, for the purposes of generating a sequential illumination of the entire illumination field 31 or the measurement field 19 by the field facet imaging channels 12a.

The first of these displacement actuators is shown at 35 in FIG. 1 and leads to a relative displacement of the field facet mirror 6 overall or of one of the field facet groups 8 of the field facet mirror 6, as indicated in FIG. 1 by a double-headed arrow 36. This relative displacement 36 can run parallel to a facet arrangement plane of the mirror carrier or of the main body 6a of the field facet mirror 6. As an alternative or in addition thereto, the displacement actuator 35 can bring about a relative displacement perpendicular to this arrangement plane of the field facets 7 on the main body 6a, which is indicated in FIG. 1 by a further double-headed arrow 36a.

A further one of these displacement actuators is illustrated at 37 in FIG. 1. This is a tilt actuator for tilting the pupil facet mirror 10 or for tilting a portion of the pupil facet mirror 10, which carries a group of the pupil facets 11, overall about an axis parallel to the x-axis, as indicated in FIG. 1 by a double-headed arrow 38. As an alternative or in addition thereto, the displacement actuator 37 can bring about a displacement of the pupil facet mirror 10 perpendicular to an arrangement plane of the mirror carrier or the main body 10a, as indicated in FIG. 1 by a double-headed arrow 38a.

A further one of these displacement actuators is indicated at 39 in FIG. 1 as a tilt actuator for the condenser mirror 13 of the transfer optical unit 16. This tilt actuator brings about a tilt of the condenser mirror 13 about an axis parallel to the x-axis, as indicated in FIG. 1 by a double-headed arrow 40. As an alternative or in addition thereto, the displacement actuator can bring about a displacement of the condenser mirror 13 perpendicular to its reflection surface, such as in a normal direction at the point of incidence of the illumination light 3 on the condenser mirror 13, as indicated in FIG. 1 by a double-headed arrow 40a.

A further displacement actuator is indicated schematically at 41 in FIG. 1 and brings about a translation displacement of the illumination optical unit 28 relative to the field stop 29 or to the projection optical unit 20, as indicated in FIG. 1 by a double-headed arrow 42. As an alternative or in addition thereto, the displacement actuator 41 can bring about a tilt of the entire illumination optical unit 28 relative to the field stop 29 or to the projection optical unit 20 about an axis parallel to the x-axis, as indicated in FIG. 1 by a double-headed arrow 42a.

A complete or full illumination of the entire illumination field 31 is also ensured with the aid of the embodiment explained above in conjunction with FIGS. 6 and 7, for example.

To illuminate the entire illumination field 31 or the measurement field 19 with the aid of the relative displacement 33 it is sufficient to have an absolute displacement along the field dimension y which in the range of 20% to 50% corresponds to a corresponding y-extent of the respective field facet image 12.

The displacement actuators 35, 37, 39 or 41 need not be continuously displaceable. A discreet actuation, for example between two end stops, is sufficient. A discrete actuation can also be achieved, for example, by changing spacers, for example spacer disks.

End stops of the actuators 7a, 35, 37, 39 and 41 can have an adjustable embodiment.

The design of an illumination light beam path in the illumination optical unit 28 can be such that a displacement of the field facet mirror 6 along the degree of freedom 36 leads to a displacement of the illumination of the illumination field 31 by the same absolute value in the y-direction. The illumination optical unit 28 can also be designed such that there is an imaging scale with an absolute value not equal to 1 between the field facets 7 and their images 12. In this case, the displacement of the field facet mirror 6 along the degree of freedom 36 leads to a displacement of the illumination of the illumination field 31 which is greater by the just defined imaging scale.

To bring about a displacement of the illumination of the illumination field 31 in the y-direction by for example 3 mm via the displacement degree of freedom 38, a tilt of the main body 10a of the pupil facet mirror 10 through approximately 1 mrad or a tilt of the condenser mirror 13 (degree of freedom 40) through approximately 0.5 mrad to 1 mrad may be used.

A combination of a displacement through the aforementioned degrees of freedom may also be possible to ensure a complete or full illumination of the illumination field 31 or of the measurement field 19.

A further embodiment of a measurement illumination optical unit is described below with reference to FIG. 8. Components and functions which have already been explained above with reference to FIGS. 1 to 7 bear the same reference signs and will not be discussed again in detail.

Figure 8:
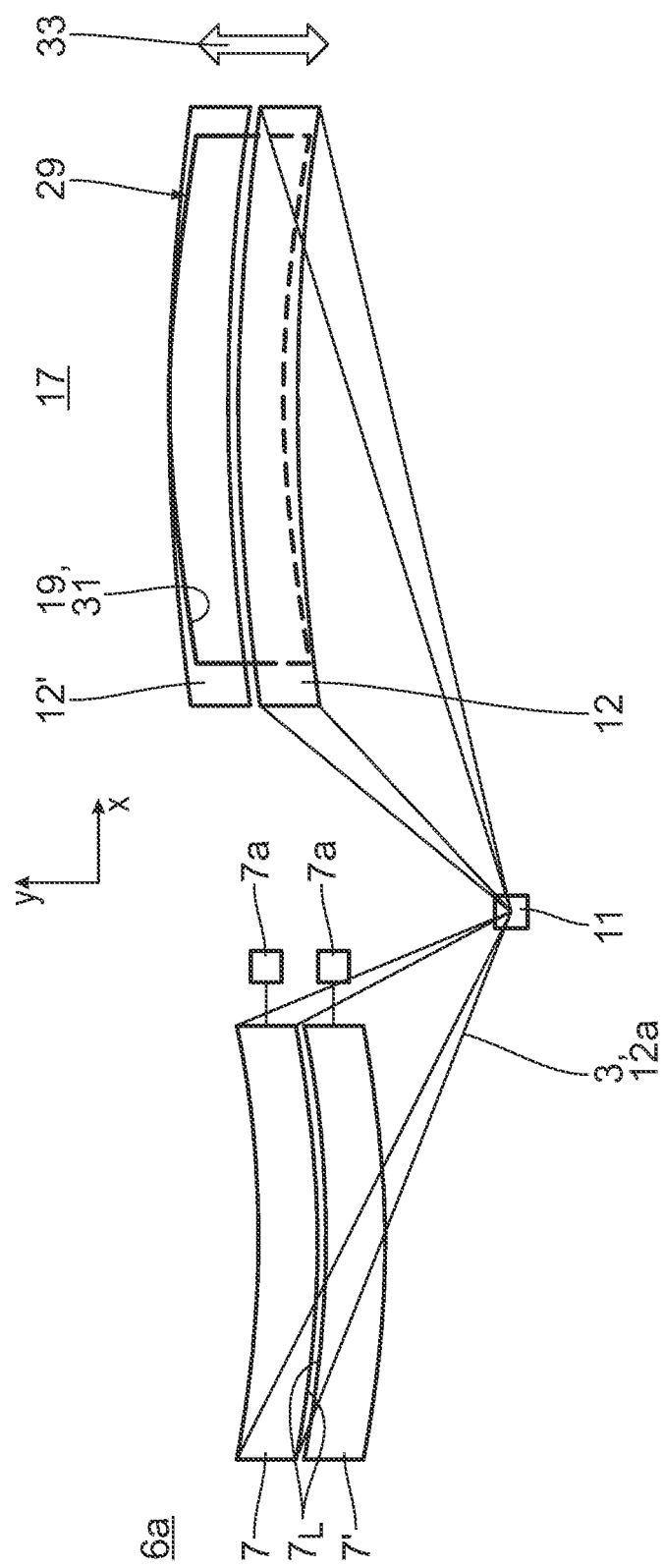
FIG. 8 shows in an illustration similar to FIG. 5A, albeit with only two facets and their field facet images being illustrated, a beam guidance of the illumination light in the case of an alternative embodiment of the measurement illumination optical unit, once again via one and the same pupil facet of the pupil facet mirror.

The measurement illumination optical unit according to FIG. 8 can be considered to be a combination of the measurement illumination optical units which have already been explained above, for example with reference to FIGS. 5 to 7. Firstly, the measurement illumination optical unit according to FIG. 8 once again includes facet field tilt actuators 7a, which allow illumination light 3 to be guided into the object plane 17 via a plurality of adjacent field facets 7′, 7″ and one and the same pupil facet 11. At the same time, the measurement illumination optical unit according to FIG. 8 includes at least one displacement actuator in the style of the displacement actuators 35, 37, 39, 41, which were described above in conjunction with FIG. 1, and so a relative displacement 33 is once again ensured between the field facet images 12, 12' and the illumination field 31 or the measurement field 19. Thus, a full illumination of the illumination field 31 or of the measurement field 19 is achieved by a combination of the measures explained above, for example in conjunction with FIGS. 5 to 7.

A further embodiment of a projection exposure apparatus 1, once again with a measurement illumination optical unit, is described below with reference to FIG. 9. Components and functions corresponding to those which have been already explained above with reference to FIGS. 1 to 8 bear the same reference signs and will not be discussed again in detail.

Figure 9:
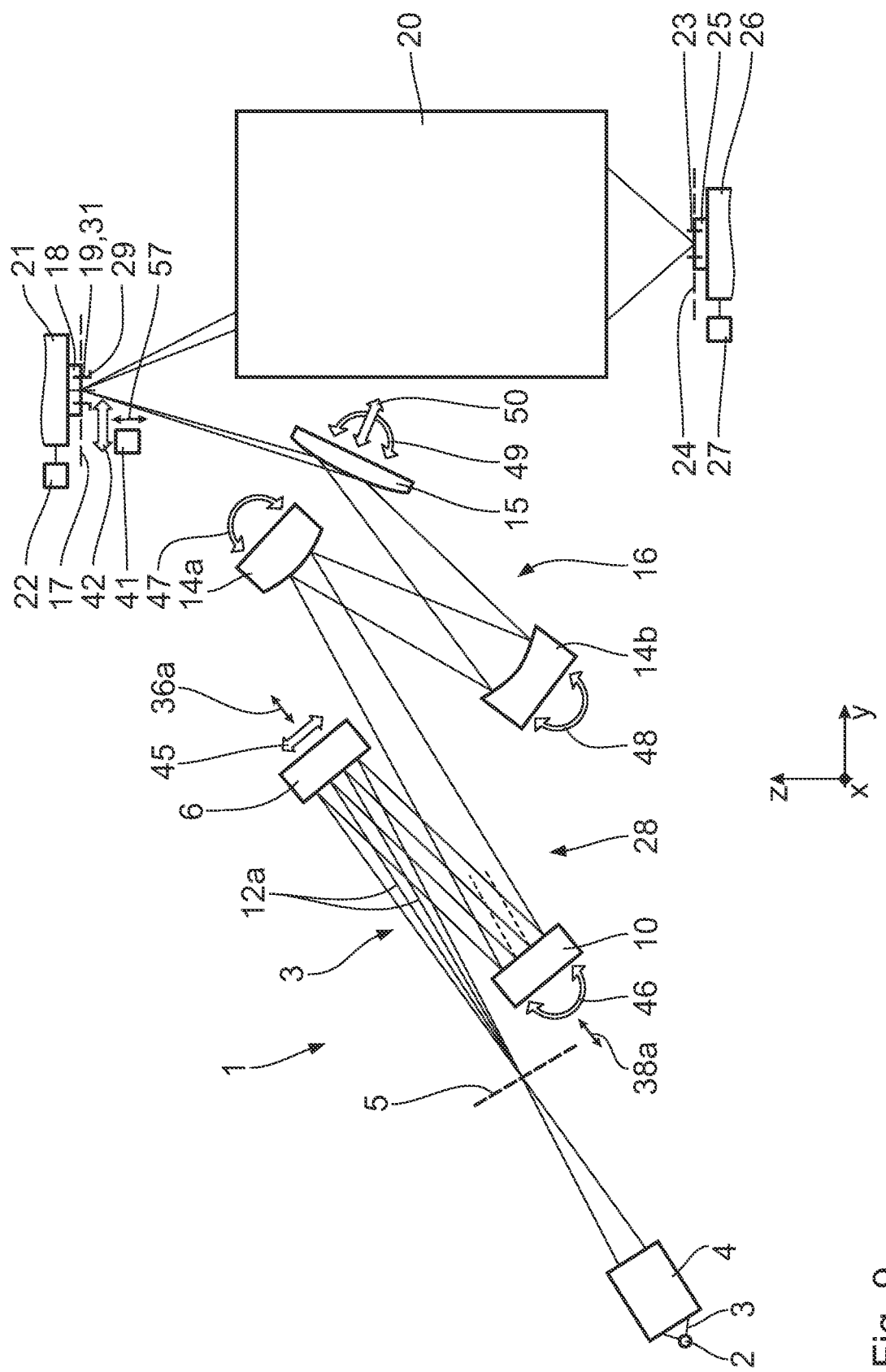
FIG. 9 shows a further embodiment of a measurement illumination optical unit with two facet mirrors and a downstream transfer optical unit with three mirrors.

Instead of a single condenser mirror, the transfer optical unit 16 according to FIG. 9 has a total of three EUV mirrors 14a, 14b and 15 for imaging the field facets of the field facet mirror 6 into the object plane 17. The two EUV mirrors 14a, 14b are configured as NI (normal incidence) mirrors with an angle of incidence of the illumination light 3 that is less than 45°. The EUV mirror 15 is embodied as a GI (grazing incidence) mirror with an angle of incidence of the illumination light 3 that is greater than 45°. The transfer optical unit 16 with the mirrors 14a, 14b and 15 can moreover bring about imaging of an illumination pupil plane in the region of an arrangement plane of the pupil facet mirror 10 into an entry pupil of the projection optical unit 20. In principle, such a structure of an illumination optical unit is known from DE 10 2015 208 571 A1.

FIG. 9 once again elucidates exemplary embodiments for generating the relative displacement 33 (cf. FIGS. 7 and 8) by the use of appropriate displacement actuators (not illustrated in more detail) by way of a representation of the respective displacement degrees of freedom by arrows.

One of these degrees of freedom for generating the relative displacement 33 is shown at 45 in FIG. 9 and leads to a relative displacement of the field facet mirror 6 overall or of one of the field facet groups of the field facet mirror 6, as has already been explained in conjunction with FIG. 1.

A further one of these degrees of freedom is illustrated at 46 in FIG. 9 and ensures a tilt of the pupil facet mirror 10 overall about an axis parallel to the x-axis.

A further one of these degrees of freedom is illustrated at 47 in FIG. 9 and ensures a tilt of the EUV mirror 14a about an axis parallel to the x-axis.

A further one of these degrees of freedom is illustrated at 48 in FIG. 9 and ensures a tilt of the EUV mirror 14b about an axis parallel to the x-axis.

A further one of these degrees of freedom is the displacement degree of freedom 42 (translational displacement of the illumination optical unit 28 relative to the field stop 29 or to the projection optical unit 20) already explained in conjunction with FIG. 1.

A further one of these degrees of freedom 49 ensures a tilt of the EUV mirror 15 about an axis parallel to the x-axis.

A further one of these degrees of freedom 50 ensures a relative displacement of the EUV mirror 15 approximately perpendicular to its GI reflection surface (cf. double-headed arrow 50 in FIG. 9).

It also applies here in turn that the displacement actuators realizing the degrees of freedom 42 and 45 to 50 need not be displaceable continuously but that a discrete actuation may be sufficient, as explained above in conjunction with the displacement actuators of the embodiment of the measurement illumination optical unit according to FIGS. 1 and 8.

As an alternative to a transfer optical unit 16 with exactly one mirror like in the embodiment according to FIG. 1 or to a transfer optical unit with exactly three mirrors like in the embodiment according to FIG. 9, the transfer optical unit may also include for example two or else more than three mirrors. In principle, it may also be possible to dispense with the transfer optical unit overall such that, for example, the field facet mirror 6 and the pupil facet mirror 10 represent the only components guiding the illumination light 3 between the intermediate focal plane 5 and the object plane 17.

A first direction of incidence of the illumination light 3 following the reflection at the collector 4 can be obliquely from the top, as illustrated in the embodiment according to FIG. 1, or obliquely from the bottom, as illustrated in FIG. 9. A direction of incidence perpendicular from above or perpendicular from below, for example, is also possible, the direction of incidence then being converted accordingly into the direction of incidence by the respective illumination optical unit 28 for the purposes of illuminating the object field 19.

Figure 10:
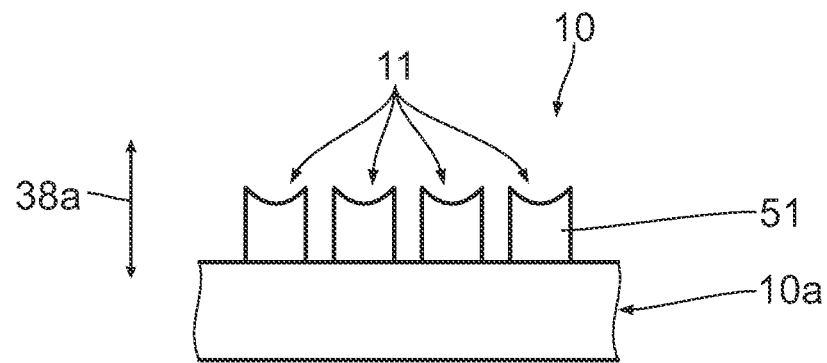
FIG. 10 schematically shows an axial section through a portion of the pupil facet mirror according to FIG. 4 as per the line X-X therein.

FIG. 10 shows an axial section of a portion of the carrier plate or of the main body 10a of the pupil facet mirror 10. The pupil facets 11 are connected to the main body 10a via actuator regions 51. By way of the actuator regions 51 it is possible to displace reflection surfaces of the pupil facets 11 along the displacement degree of freedom 38a (cf. FIG. 1), i.e., perpendicular to the facet arrangement plane of the main body 10a. By way of the actuator regions 51 it is possible to displace the pupil facets 11 individually along the degree of freedom 38a. By way of a common control of the actuator regions 51 it is also possible to attain a common displacement of the pupil facets 11 along the degree of freedom 38a. The actuator regions 51 can be configured as piezo actuators. By way of example, the amplitude of the movement can be up to 1 mm. Other actuators for a linear movement, for example linear motors, can also be used. An amplitude of the movement can range between 1 mm and 100 mm and can be 10 mm, for example.

Figure 11:
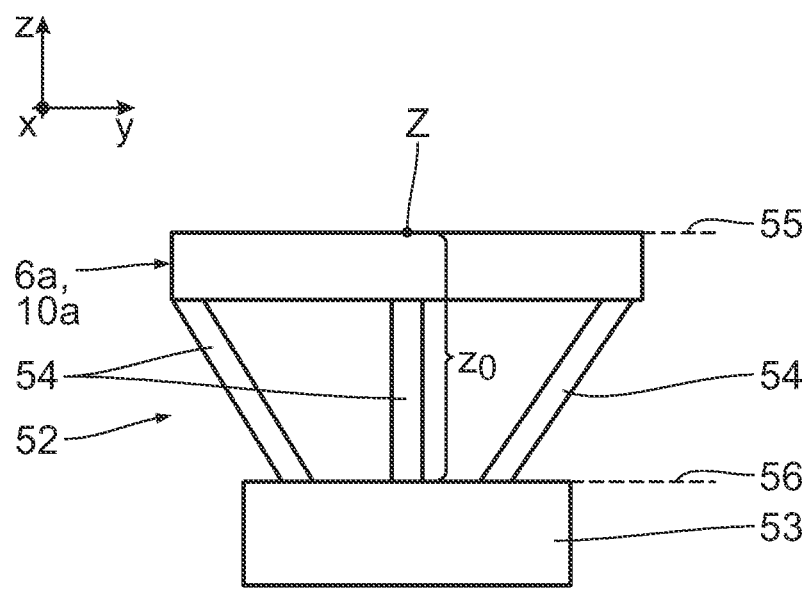
FIG. 11 schematically shows a side view of a main body of a facet mirror, for example of the field facet mirror according to FIG. 2/3 or of the pupil facet mirror according to FIG. 4, including a hexapod support connection of the main body to a frame body, with the hexapod support connection in an initial position.

FIG. 11 shows a hexapod support connection of one of the main bodies 6a or 10a, which are used in the field facet mirror 6 and/or in the pupil facet mirror 10. The main body 6a, 10a is connected to a frame body 53 of the projection exposure apparatus 1 by way of the hexapod support connection 52. FIG. 11 schematically illustrates three hexapod legs 54 of the hexapod support connection 52. FIG. 11 shows the main body 6a, 10a in an initial position with an initial spacing $z_o$ between the center Z of the facet arrangement on the main body 6a, 10a and a corresponding central region of the frame body 53. In this initial position, a facet arrangement plane 55 of the main body 6a, 10a is parallel to a frame plane 56 of the frame body 53.

Figure 12:
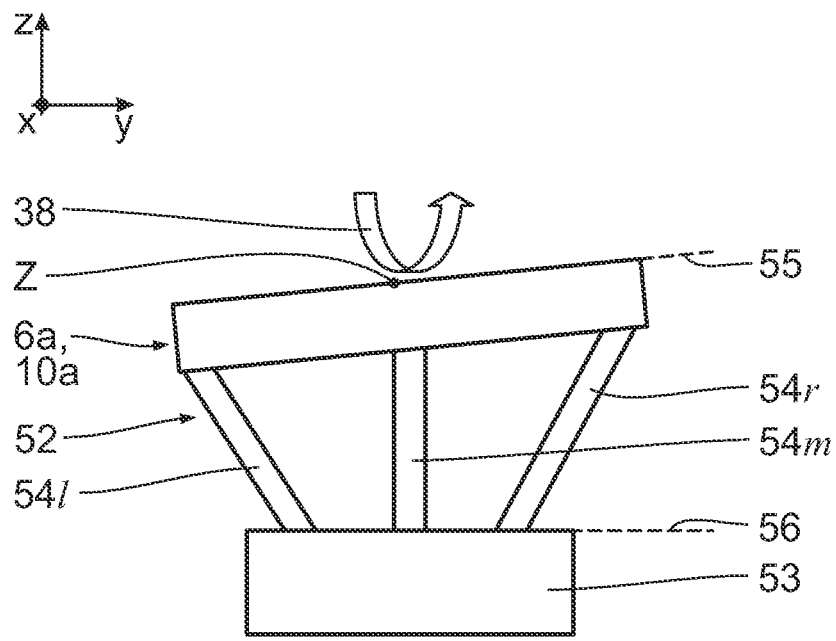
FIG. 12 shows the arrangement according to FIG. 11 with the hexapod support connection in a first tilt position.
Figure 13:
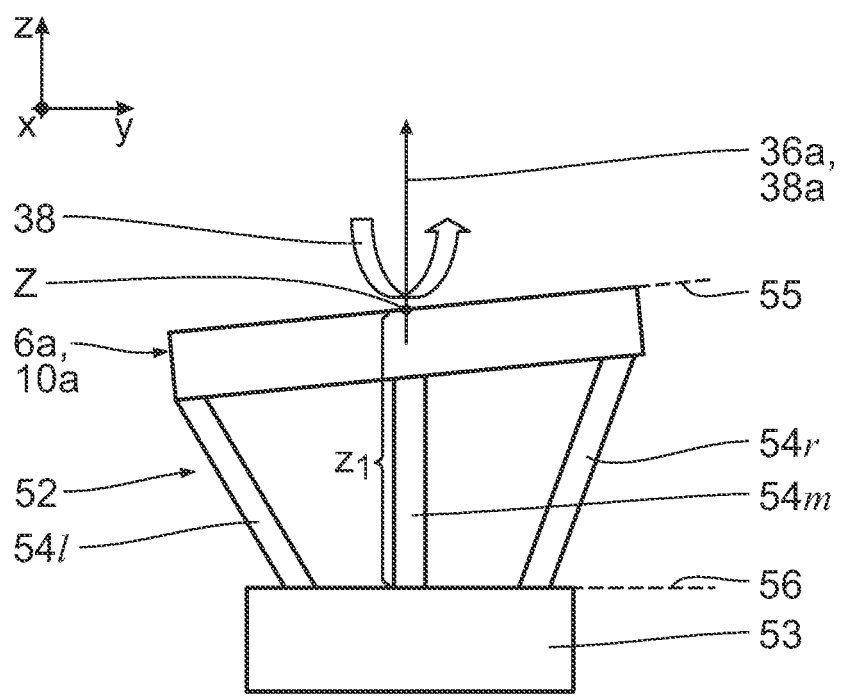
FIG. 13 shows the arrangement according to FIG. 11 with the hexapod support connection in a second tilt position, which has an additional linear displacement perpendicular to a facet arrangement plane of the main body in relation to the first tilt position.

FIGS. 12 and 13 show two different measurement positions of the main body 6a, 10a, which are displaced relative to the initial position according to FIG. 11.

In a first measurement position according to FIG. 12, a hexapod leg 54r, which is illustrated to the right in FIGS. 11 to 13, has been extended a bit and a further hexapod leg 54l, which is illustrated to the left in FIGS. 11 to 13, has been retracted in a manner corresponding thereto so that this results in a tilt of the facet arrangement plane 55 about an axis parallel to the x-axis, i.e., for example, that displacement degree of freedom 38. A hexapod leg 54m found in the middle in FIGS. 11 to 13 has the same length in the measurement position according to FIG. 12 as in the initial position according to FIG. 11.

In the second measurement position according to FIG. 13, the left hexapod leg 54*l* of FIGS. 11 to 13 has the same length as in the initial position according to FIG. 11. In the second measurement position according to FIG. 13, the middle hexapod leg 54*m* of FIGS. 11 to 13 is extended in relation to the initial position by an absolute value approximately corresponding to an extension of the right hexapod leg 54*r* in FIG. 12 In the second measurement position according to FIG. 13, the right hexapod leg 54*r* of FIGS. 11 to 13 is extended by twice the absolute value in comparison with the middle hexapod leg 54*m*. This yields a displacement of the main body 6*a*, 10*a* in the second measurement position according to FIG. 13 which in comparison with the initial position can be understood as the superposition of the displacement degrees of freedom 38 (tilt about an axis parallel to the x-axis) and 36*a* or 38*a* (translational displacement perpendicular to the facet arrangement plane 55). A distance $z_1$ between the center Z of the facet arrangement on the main body 6*a*, 10*a* and the central region of the frame body 53 in the second measurement position according to FIG. 13 is greater than the distance $z_0$ in the initial position according to FIG. 11.

The condenser mirror 13 can also be connected to a frame body of the projection exposure apparatus 1 by way of a corresponding hexapod support connection.

The other displacement degrees of freedom that were explained above, such as in conjunction with FIGS. 1 and 9, can also readily be attained using the hexapod support connection 52.

Figure 14:
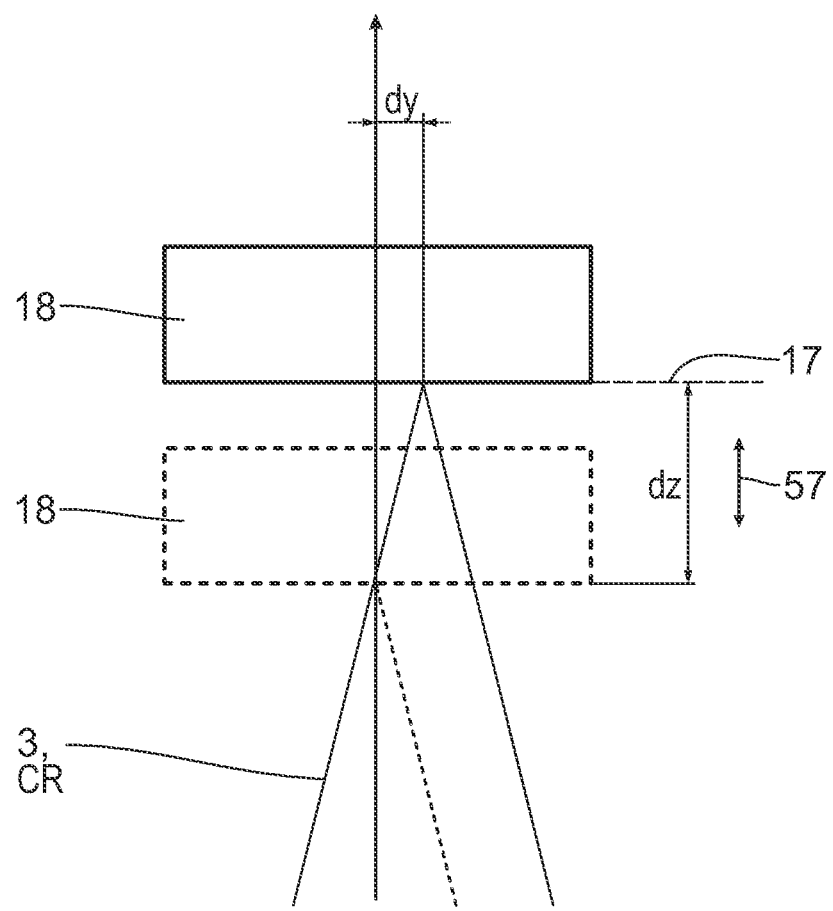
FIG. 14 schematically shows in an illustration similar to FIG. 1 an object to be illuminated by the illumination optical unit, the object being shown in a first position illustrated using full lines and in a second position that is displaced perpendicular to the object plane.

FIG. 14 shows a displacement 57 of the reticle 18 perpendicular to the object plane 17 as an additional displacement of degree of freedom for ensuring a dynamic complete or full illumination of the entire illumination field 31 or of the measurement field 19. Such a z-displacement 57 can be brought about by way of the object displacement drive 22.

A first initial position of the reticle 18 is illustrated using full lines in FIG. 14. A measurement position of the reticle which is displaced by an absolute value dz perpendicular to the object plane 17 along the displacement degree of freedom 57 (cf. also FIG. 1) in relation to the initial position is illustrated in FIG. 14 using dashed lines. This yields a displacement dy of an illumination of the illumination field 31 or of the measurement field 19, as elucidated by the illustration in FIG. 14 of a reflected chief ray CR of a central field point of the illumination light 3, by way of the reticle 18 firstly in the initial position (full lines) and secondly in the measurement position (dashed lines). In turn, this displacement dy can be used for the dynamic complete or full illumination of the entire illumination field 31 or of the measurement field 19. The following holds true:

$$dy = dz \sin(CRA)$$

Here, CRA is the angle of incidence of the chief ray CR of the central field point on the object plane 17. CRA can range between 3° and 9° and can be 6°, for example. For displacement dy of 3 mm, a dz-displacement of approximately 30 mm, for example, would be used.

A value by which the hexapod legs 54 of the hexapod support connection 52 is extended or retracted can be in the region of +/−100 µm or +/−50 µm.

A displacement actuator system for bringing about at least one of the above-described degrees of freedom can be combined with the active vibration damping. Moreover, a measurement/closed-loop control of the respective displacement movement is possible.

The measurement illumination optical unit 28 can include a detection device 60, indicated schematically in FIG. 1, for spatially resolved capture of an illumination light intensity in the measurement field 19 or 31. Furthermore, the measurement illumination optical unit 28 can include a sensor 61 for capturing a position of an optical surface of the respective optical component 6, 10, 13, 28, the sensor being elucidated schematically and in exemplary fashion in FIG. 1 for the purposes of capturing the position of the pupil facet mirror 10.

The detection device 60 can be a CCD sensor on which the measurement field 19 or 31 is imaged.

The sensor 61 can be an optical sensor or else any other position-sensitive sensor.

Firstly the detection device 60 and secondly the sensor 61 are signal connected to the respective displacement actuator 35, 37, 39, 41.

A controlled movement of the respective displacement actuator can be ensured by way of appropriate processing by way of an open-loop/closed-loop control unit 62, which is signal-connected to the actuators and to the detection device 60 and the sensor 61. In this way, it is possible to keep illumination performance variables, for example, within specified tolerances.

What is claimed is:

1. An illumination optical unit configured to guide illumination light into an object field, the illumination optical unit comprising:
   a field facet mirror comprising a plurality of field facets;
   a pupil facet mirror comprising a plurality of pupil facets configured to overlay field facet images of the field facets in the object field and so that a field facet imaging channel of the illumination light is guided via any one field facet and any one pupil facet; and
   a measurement field illumination device comprising a displacement actuator,
   wherein:
      the illumination optical unit is configured so that a measurement field has a greater extent along one first field dimension than any one of the field facet images;
      the measurement field illumination device is configured to influence guidance of the illumination light via the field facet imaging channels so that the entire measurement field is illuminated via the field facet imaging channels; and
      the displacement actuator is configured to displace an optical component configured to guide the illumination light between an illumination light source and the object field to sequentially illuminate the entire measurement field via the field facet imaging channels.

2. The illumination optical unit of claim 1, wherein the object field is an object field of a projection exposure apparatus for EUV lithography.

3. The illumination optical unit of claim 2, wherein the illumination optical unit is a production illumination optical unit of the projection exposure apparatus.

4. The illumination optical unit of claim 2, wherein:
   the object field is an object field of a projection optical unit of the projection exposure apparatus for EUV lithography;
   the object field is downstream of the illumination optical unit;

the projection optical unit is configured to image the object field into an image field; and the displacement actuator is configured to displace the illumination optical unit relative to the object field.

5. The illumination optical unit of claim 1, wherein the displacement actuator is configured to displace at least some of the field facet images together along the one field dimension relative to the measurement field.

6. The illumination optical unit of claim 1, wherein the displacement actuator is configured to interact with a portion of the field facet mirror which carries a field facet group to displace the field facet mirror or the portion of the field facet mirror.

7. The illumination optical unit of claim 1, wherein the displacement actuator is configured to interact with a portion of the pupil facet mirror which carries a pupil facet group to displace the pupil facet mirror or the portion of the pupil facet mirror.

8. The illumination optical unit of claim 1, further comprising a mirror component configured to guide the illumination light between the pupil facet mirror and the object field, wherein the displacement actuator is configured to displace the mirror component.

9. The illumination optical unit of claim 1, wherein the object field is downstream of the optical unit, and the displacement actuator is configured to displace the optical unit relative to the object field.

10. The illumination optical unit of claim 1, wherein the displacement actuator is configured to displace an object holder relative to the remainder of the optical unit.

11. An illumination system, comprising:
an illumination optical unit according to claim 1; and
a light source configured to provide the illumination light.

12. An illumination system, comprising:
an illumination optical unit according to claim 1; and
a projection optical unit configured to image the object field into an image field.

13. An illumination system, comprising:
an illumination optical unit according to claim 1; and
a projection optical unit configured to image the object field into an image field,
wherein the displacement actuator is configured to translate the illumination optical unit relative to the projection optical unit.

14. An apparatus, comprising:
an illumination system which comprises an illumination optical unit according to claim 1,
wherein the apparatus is a projection exposure apparatus for EUV lithography.

15. A method of using a projection exposure apparatus for EUV lithography comprising an illumination optical unit and a projection optical unit, the method comprising:
using the illumination optical unit to illuminate an object field of the projection optical unit; and
using the projection optical unit to image a portion of the object field into an image field,
wherein the illumination optical unit comprises an illumination optical unit according to claim 1.

16. An illumination optical unit configured to guide illumination light to an object field, the illumination optical unit comprising:
a field facet mirror comprising a plurality of field facets;
a pupil facet mirror comprising a plurality of pupil facets configured to overlay field facet images of the field facets in the object field and so that a field facet imaging channel of the illumination light is guided via any one field facet and any one pupil facet; and
a field stop configured to define a field boundary of an illumination field of the illumination light in the object field,
wherein:
the illumination field has a greater extent along one field dimension than any one of the field facet images; and
at least some of the field facets comprise tilt actuators configured so that the illumination light is guided into the illumination field via various field facets and one and the same pupil facet.

17. The illumination optical unit of claim 16, wherein:
the field facets comprise a reflection surface with an aspect ratio of greater than two; and
the tilt actuators are configured so that the illumination light is guided into the illumination field via field facets which are adjacent to one another via one field facet longitudinal side and via one and the same pupil facet.

18. The illumination optical unit of claim 16, wherein the object field is an object field of a projection exposure apparatus for EUV lithography.

19. The illumination optical unit of claim 18, wherein the illumination optical unit is a production illumination optical unit of the projection exposure apparatus.

20. An apparatus, comprising:
an illumination system which comprises an illumination optical unit according to claim 16,
wherein the apparatus is a projection exposure apparatus for EUV lithography.

* * * * *